US012764876B2

(12) United States Patent
Sasaki et al.

(10) Patent No.: US 12,764,876 B2
(45) Date of Patent: Oct. 13, 2026

(54) ELECTRONIC DEVICE

(71) Applicant: YOKOWO CO., LTD., Tokyo (JP)

(72) Inventors: Ryo Sasaki, Tomioka (JP); Noriyoshi Nakada, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 111 days.

(21) Appl. No.: 18/684,716

(22) PCT Filed: Aug. 2, 2022

(86) PCT No.: PCT/JP2022/029633
§ 371 (c)(1),
(2) Date: Feb. 19, 2024

(87) PCT Pub. No.: WO2023/026789
PCT Pub. Date: Mar. 2, 2023

(65) Prior Publication Data

US 2024/0431047 A1 Dec. 26, 2024

(30) Foreign Application Priority Data

Aug. 27, 2021 (JP) ................................ 2021-138872

(51) Int. Cl.
*H05K 5/02* (2006.01)
*H05K 5/00* (2006.01)

(52) U.S. Cl.
CPC ......... *H05K 5/0217* (2013.01); *H05K 5/0056* (2013.01)

(58) Field of Classification Search
CPC .. H05K 5/0217; H05K 7/1461; H05K 5/0056; H05K 5/0047
See application file for complete search history.

(56) References Cited

U.S. PATENT DOCUMENTS

| | | | | |
|---|---|---|---|---|
| 5,394,306 | A * | 2/1995 | Koenck | H02B 1/48<br>174/544 |
| 7,242,552 | B2 * | 7/2007 | Kudo | G11B 33/08<br>360/97.12 |
| 2018/0301796 | A1 * | 10/2018 | Yamase | H01Q 1/521 |
| 2019/0373750 | A1 * | 12/2019 | Omote | H05K 7/1417 |

FOREIGN PATENT DOCUMENTS

| | | | |
|---|---|---|---|
| JP | H06-079193 | U | 11/1994 |
| JP | 2000-244142 | A | 9/2000 |
| JP | 2011-199440 | A | 10/2011 |
| JP | 2012-028611 | A | 2/2012 |

(Continued)

OTHER PUBLICATIONS

Machine translation of JP2021019158 (Year: 2025).*

(Continued)

*Primary Examiner* — Sagar Shrestha
(74) *Attorney, Agent, or Firm* — XSENSUS LLP

(57) ABSTRACT

An electronic device includes: a base; a case forming an accommodation space together with the base; an electronic component accommodated in the accommodation space; an electronic component at which the electronic component is disposed; and an elastic body sandwiched between the base and the case, the elastic body including a holding portion to hold the plate-shaped member.

14 Claims, 9 Drawing Sheets

(56) References Cited

FOREIGN PATENT DOCUMENTS

JP 2021-019158 A 2/2021

OTHER PUBLICATIONS

Machine translation of JP H0679193 (Year: 2035).*
Machine Translation of WO 2016194702 (Year: 2026).*
Office Action issued on May 27, 2025, in corresponding Japanese patent Application No. 2021-138872, 3 pages.
International Search Report and Written Opinion mailed on Oct. 25, 2022, received for PCT Application PCT/JP2022/029633, filed on Aug. 2, 2022, 10 pages including English Translation.

* cited by examiner

ELECTRONIC DEVICE

CROSS-REFERENCE TO RELATED APPLICATIONS

The present application is based on PCT filing PCT/JP2022/029633, filed Aug. 2, 2022,which claims priority from Japanese Patent Application No. 2021-138872, filed Aug. 27,2021, the contents of each are hereby incorporated by reference.

TECHNICAL FIELD

This invention relates to an electronic device.

BACKGROUND ART

PTL 1 discloses an antenna device in which a substrate having a patch antenna serving as an electronic component is disposed thereat is fixed to a base with screws.

CITATION LIST

Patent Literature

[PTL 1] Japanese Patent Application Publication No. 2011-199440

SUMMARY OF INVENTION

Technical Problem

Due to shock, vibrations, and/or the like received by the antenna device, stress may be concentrated on screwed parts of the substrate, which may damage the substrate. Even in a plate-shaped member at which an electronic component other than an antenna, such as a camera, a light emitter, a sound emitter, and/or the like, is disposed, the same or similar phenomenon in which a plate-shaped member is damaged by shock, vibrations, and/or the like can occur.

An example of an object of the present disclosure is to suppress damage to a plate-shaped member at which an electronic component is disposed. Other objects of the present disclosure will become apparent from the present specification given herein.

Solution to Problem

An aspect of the present disclosure is an electronic device comprising: a base; a case forming an accommodation space together with the base; an electronic component accommodated in the accommodation space; a plate-shaped member at which the electronic component is disposed; and an elastic body sandwiched between the base and the case, the elastic body including a holding portion to hold the plate-shaped member.

According to an aspect described above of the present disclosure, it is possible to suppress damage to a plate-shaped member at which an electronic component is disposed.

DESCRIPTION OF EMBODIMENTS

Figure 1:
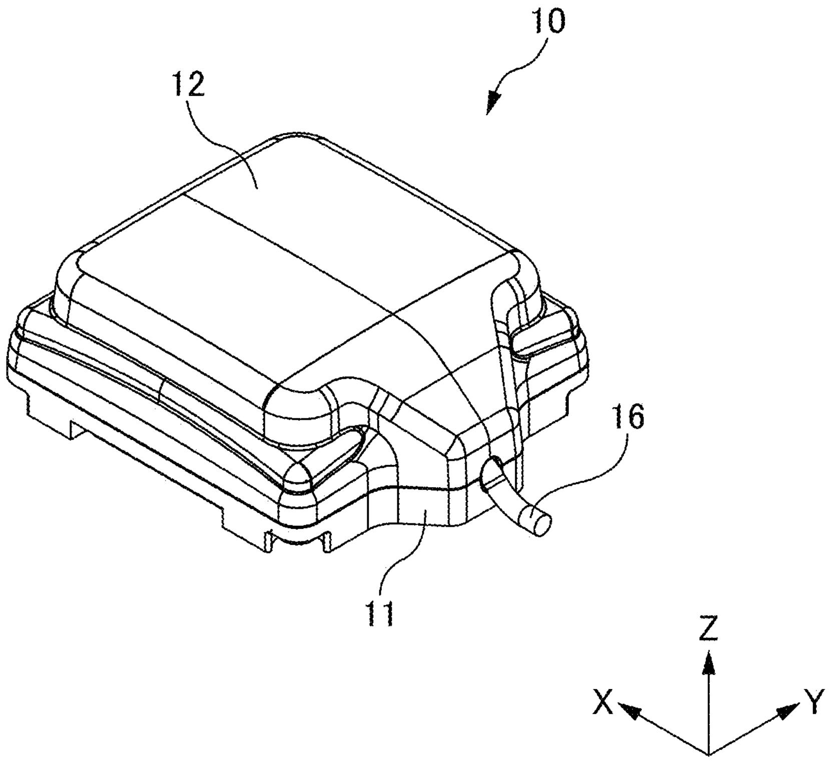
FIG. 1 is a perspective view illustrating an electronic device 10 in a first embodiment.

At least following matters will become apparent from the present description and the accompanying drawings.

Hereinafter, preferred embodiments of the present disclosure will be described with reference to the drawings. The same or equivalent components, members, and the like illustrated in the drawings are given the same reference numerals, and an overlapping description is omitted as appropriate.

Overview of Electronic Device 10 of First Embodiment

First, an overview of a configuration of an electronic device 10 of a first embodiment will be described with reference to FIGS. 1 and 2.

FIG. 1 is a perspective view of the electronic device 10 in the first embodiment. FIG. 2 is an exploded perspective view of the antenna device 1 in the first embodiment.

Figure 2:
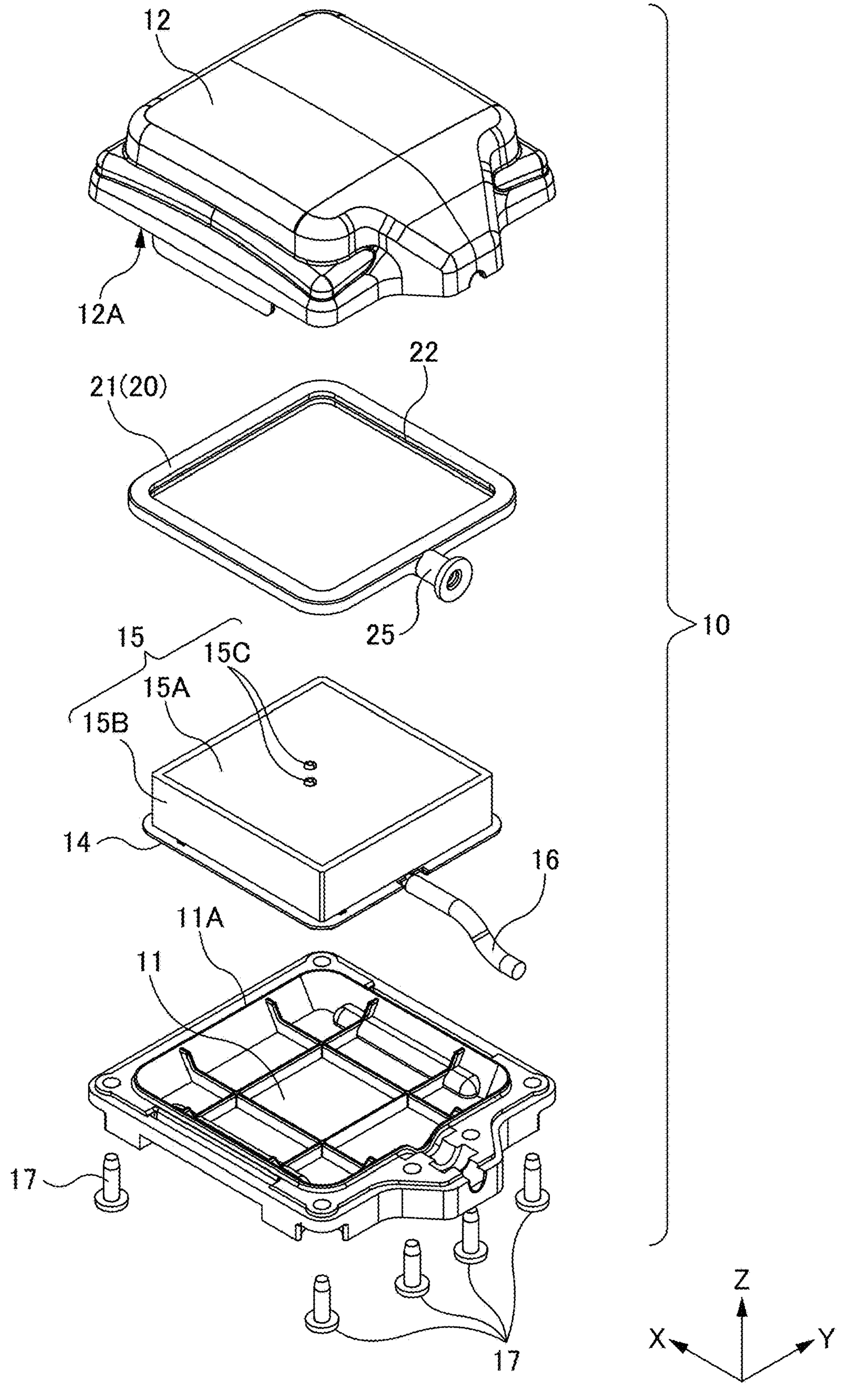
FIG. 2 is an exploded perspective view illustrating an electronic device 10 in a first embodiment.

As illustrated in FIGS. 1 and 2, directions parallel to the surface where the electronic device 10 is provided are defined as an X direction and a Y direction. The direction in which a coaxial cable 16 connected to the electronic device 10 extends is defined as the X direction, and the direction perpendicular to the X direction is defined as the Y direction. Further, the direction perpendicular to the surface where the electronic device 10 is provided is defined as a Z direction. The X direction may be referred to as "front-rear direction", the Y direction may be referred to as "left-right direction", and the Z direction may be referred to as "up-down direction". Further, as illustrated in FIGS. 1 and 2, the directions in which the arrows point are defined as +X direction (forward direction), +Y direction (rightward direction), and +Z direction (upward direction), respectively.

The electronic device 10 is a device that includes an electronic component and a plate-shaped member at which the electronic component is disposed. In an embodiment of the present disclosure, the electronic device 10 is an antenna device that includes an antenna (an electronic component 15 which is a patch antenna described later) and a substrate (a plate-shaped member 14 which is a substrate, described later) at which the antenna is disposed. Accordingly, hereinafter, the "electronic device" may be referred to as "antenna device".

Further, in an embodiment of the present disclosure, the electronic device 10 is a vehicular antenna device to be used at a vehicle not illustrated. In an embodiment of the present disclosure, the term "vehicular" means "being mountable to a vehicle", and thus it is not limited to an aspect of being attached to a vehicle, but also includes an aspect of being brought into a vehicle and used in a vehicle. The electronic device 10, which is a vehicular antenna device, is provided at a roof or in an instrument panel of a vehicle. However, the electronic device 10 may be provided at a part of the vehicle other than the roof, the inside of the instrument panel, and the like. Further, the electronic device 10 may be an antenna device other than that of an aspect of being used in a wheeled "vehicle". The electronic device 10 may be used for, for example, an air vehicle such as a drone or the like, and a mobile vehicle such as a probe, a robot, wheel-less construction machinery, agricultural machinery, a vessel, or the like.

The electronic device 10 may be a device other than an antenna device, as long as it includes an electronic component and a plate-shaped member at which the electronic component is disposed. The electronic device 10 may be a measurement device including a sensor component and a substrate at which the sensor component is disposed and a signal converter and the like are mounted, for example. Further, the electronic device 10 may be a light emitter device including a light emitter and a control substrate at which the light emitter is disposed, the control substrate being configured to control lighting of the light emitter, for example.

In addition to an example described above, the electronic device 10 may be an imaging device that includes a camera and a substrate at which the camera is disposed to perform image processing of still images and/or moving images, for example. Such an imaging device includes devices having video cameras used in drive recorders and rear-view cameras of vehicles, for example. Further, the electronic device 10 may be a sound emitter device including a sound emitter that emits sounds such as voices, sirens, and/or the like, and a control substrate at which the sound emitter is disposed to control the volume and the like of the sound emitted by the sound emitter, for example.

Figure 4A:
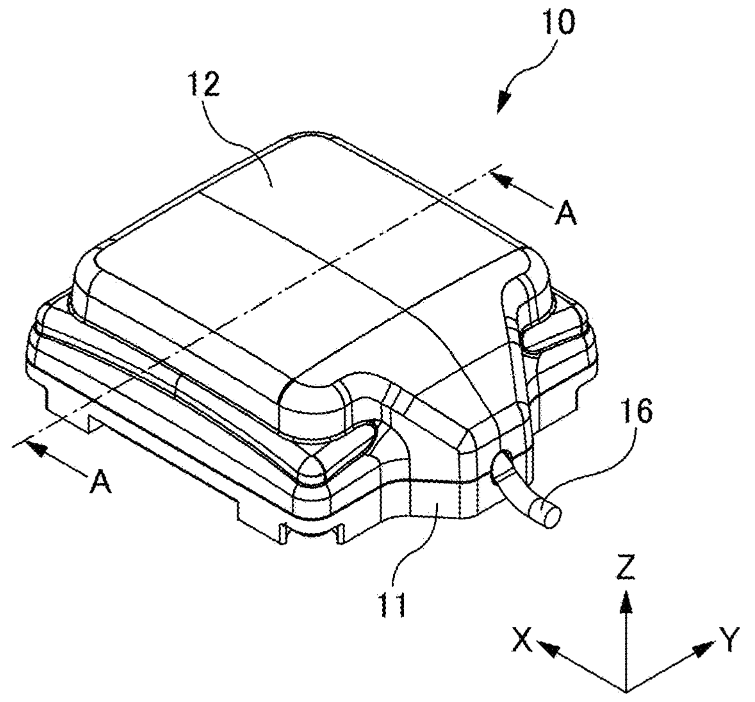
FIG. 4A is a perspective view of an electronic device 10 illustrating a cutting line.
Figure 4B:
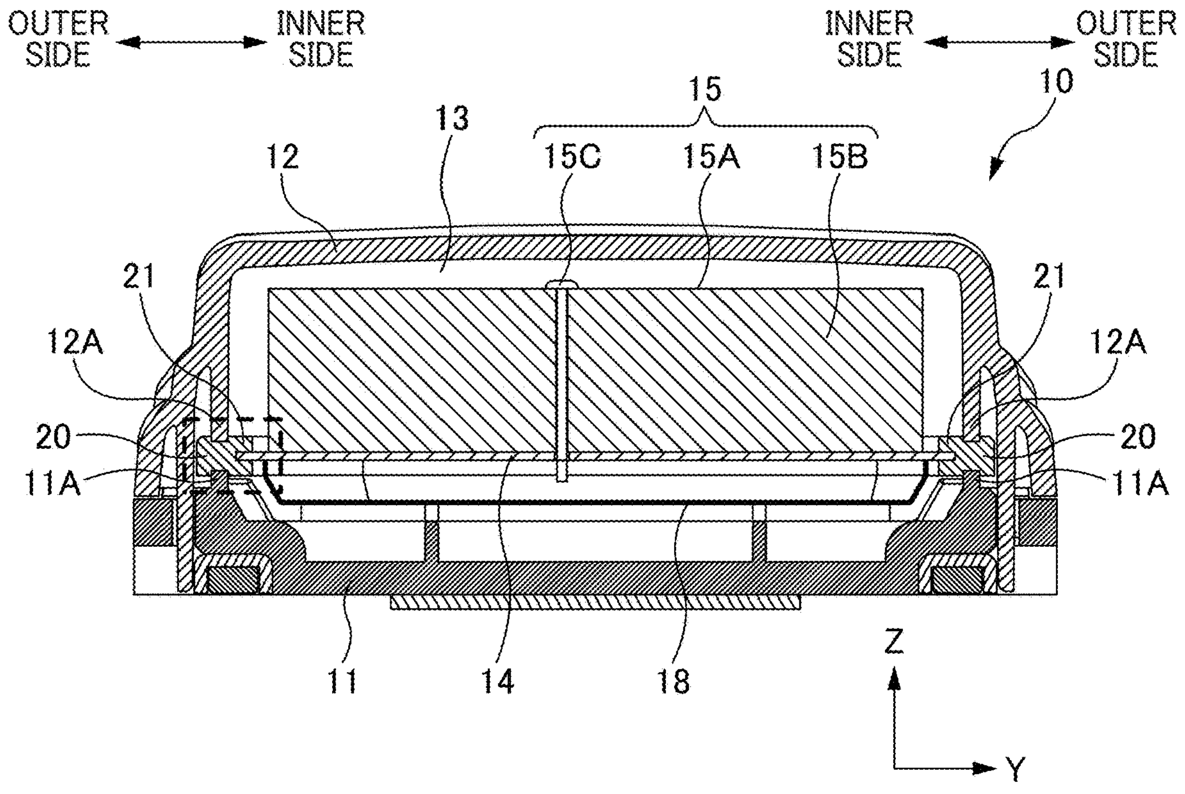
FIG. 4B is a cross-sectional view illustrating an electronic device 10 taken along a line A-A.

The electronic device 10 includes a base 11, a case 12, a plate-shaped member 14, a shield cover 18, an electronic component 15, and an elastic body 20, as illustrated in FIG. 2 and FIG. 4B described later.

The base 11 is a member forming the bottom surface of the electronic device 10. In an embodiment of the present disclosure in which the electronic device 10 is an antenna device, the base 11 is made of insulating resin. However, the base 11 may be made of a material other than insulating resin, such as metal or the like. Further, the base 11 may include an insulating resin part and a metal part. The base 11 is fixed to the case 12 with a plurality of screws 17, as illustrated in FIG. 2. However, the base 11 is not limited to the case where the base 11 is fixed to the case 12 with screws, but may be fixed thereto by snap fit, welding, adhesion, and/or the like.

The base 11 may function as a ground of an antenna by being made of metal and/or the like or including a metal plate and/or the like.

Further, the base 11 can freely combine members to form the bottom surface of the electronic device 10.

The case 12 is a member forming the upper surface of the electronic device 10. In an embodiment of the present disclosure, the electronic device 10 is an antenna device, and thus the case 12 is made of insulating resin. When the electronic device 10 is an antenna device, the case 12 only has to be made of a material allowing radio waves to be passed therethrough, and thus may include an insulating resin part and a part made of another material allowing radio waves to be passed therethrough, or may be configured with members in any combination. However, in the case of electronic devices other than an antenna device, the case 12 may be made of a material other than insulating resin, such as metal or the like. Further, the case 12 may include a part made of insulating resin and a part made of metal, and may include any combination of members. The case 12 is fixed to the base 11 with the plurality of screws 17, as illustrated in FIG. 2. However, the case 12 is not limited to the case where the case 12 is fixed to the base 11 with screws, but may be fixed thereto by snap fit, welding, adhesion, and/or the like.

In an embodiment of the present disclosure, the base 11 and the case 12 accommodate at least the plate-shaped member 14 and the electronic component 15. In other words, the base 11 and the case 12 form an accommodation space 13 to accommodate the plate-shaped member 14 and the electronic component 15. Further in other words, the base 11 and the case 12 are members to cover the plate-shaped member 14 and the electronic component 15. Accordingly, hereinafter, the base 11 and the case 12 may be collectively referred to as "exterior body". Further, either one of the base 11 or the case 12 may be referred to as "exterior body".

As described above, the base 11 on the bottom surface side of the electronic device 10 and the case 12 on the top surface side of the electronic device 10 constitute the exterior body. However, an aspect of the configuration of the exterior body is not limited thereto. For example, the exterior body may be constituted by two members that are a member on the left surface side of the electronic device 10 and a member on the right surface side of the electronic device 10. Further, when the electronic device 10 is a typical shark-fin antenna, the base 11 and the case 12 may be a housing of the shark fin antenna. That is, the designations "base" and "case" in an embodiment of the present disclosure are convenient designations given based on an aspect of the structure of the exterior body.

The plate-shaped member 14 is where the electronic component 15 is disposed, such as a circuit board, a resin plate or holder, or a metal plate, for example. In an embodiment of the present disclosure, the plate-shaped member 14 is a substrate and is made of a material such as glass epoxy resin or the like, for example. However, the plate-shaped member 14 (substrate) may also be made of a material other than glass epoxy resin, such as phenol resin or the like. Further, in an embodiment of the present disclosure, it is formed into a plate shape. However, the entire plate-shaped member 14 does not have to be formed in a plate shape, but the plate-shaped member 14 may have a part formed in a shape other than a plate shape. That is, the plate-shaped member 14 may be curved, bent, or have a protruding portion or a recessed portion.

Hereinafter, the surface of the plate-shaped member 14 on the +Z direction side is defined as a "front surface", and the surface of the plate-shaped member 14 on the −Z direction side is defined as a "back surface". Further, the +Z direction side may be referred to as "front surface side" and the −Z direction side may be referred to as "back surface side".

In an embodiment of the present disclosure, the plate-shaped member 14 is a substrate. Accordingly, hereinafter, the "plate-shaped member" may be referred to as "substrate". A conductive pattern not illustrated is formed in the front surface and the back surface of the substrate 14. A ground conductor plate (ground conductor film) of the electronic component 15 which is a patch antenna described later and a conductive pattern that functions as a ground of a circuit not illustrated are formed at the front surface of the substrate 14. A conductive pattern to which a signal line of the coaxial cable 16 from an amplifier substrate (not illustrated) is connected is formed at the back surface of the substrate 14. However, the conductive pattern formed at the substrate 14 is not limited thereto, and may be different depending on the type of the electronic component 15.

The shield cover 18 is a member that electrically shields the amplifier substrate disposed at the back surface of the substrate 14 and made of metal. The shield cover 18 is attached to the back surface of the substrate 14 as illustrated in FIG. 4B, although not illustrated in FIG. 2.

The electronic component 15 is a component of the electronic device 10 that uses an electronic circuit. In an embodiment of the present disclosure, the electronic component 15 is a patch antenna. Accordingly, hereinafter, an "electronic component" may be referred to as "patch antenna". The patch antenna is a planar antenna supporting radio waves for global navigation satellite system (GNSS), for example. In an embodiment of the present disclosure, the electronic component 15 supports radio waves in the 1.5 GHz band for GNSS. The communication standard and the frequency band supported by the electronic component 15 are not limited to the above, but may be other communication standards and frequency bands.

The electronic component 15 may be an antenna other than a patch antenna, such as a monopole antenna, a dipole antenna, or the like, which supports radio waves for GSM, UMTS, LTE, and 5G, for example. Further, the electronic component 15 may be an antenna that supports radio waves for telematics, AM/FM radio, and digital terrestrial television broadcasting. Further, the electronic component 15 may be an electronic component other than an antenna, such as a sensor component, a light emitter, a camera, a sound emitter, or the like.

The electronic component 15 that is a patch antenna includes a radiating element 15A and a dielectric 15B, as illustrated in FIG. 2.

The radiating element 15A is an element capable of performing at least one of reception or transmission of signals (radio waves) of a desired frequency band, and is, in an embodiment of the present disclosure, a substantially quadrilateral conductive member having an area smaller than the area of the front surface of the dielectric 15B, as illustrated in FIG. 2. Here, the term "substantially quadrilateral" means a shape consisting of four sides including a square or a rectangle, for example, and at least part of corners thereof may be cut away obliquely relative to a side thereof, for example. Further, in the "substantially quadrilateral" shape, a recess (recessed portion) or a protrusion (protruding portion) may be provided at part of sides thereof. The shape of the radiating element 15A is not limited to a substantially-quadrilateral shape, but may be a circular shape, an elliptical shape, or the like, for example. That is, the radiating element 15A may have any shape as long as it can perform at least one of reception or transmission of signals (radio waves) of the desired frequency band.

As illustrated in FIG. 2, the radiating element 15A is provided at the front surface of the dielectric 15B. Further, the direction normal to the radiation surface of the radiating element 15A is the +Z direction.

The radiating element 15A includes feeding points 15C as illustrated in FIG. 2. The feeding points 15C are points at which a feeder of the coaxial cable 16 illustrated in FIG. 2 is electrically connected to the radiating element 15A. An embodiment of the present disclosure employs a configuration in which two feeding points 15C are provided, that is, a double-feed system. For example, the radiating element 15A of the double-feed system has a substantially square shape with equal length and width so as to be able to perform at least one of transmission or reception of desired circularly polarized waves, for example. The "substantially-square" shape is a shape included in the "substantially-quadrilateral" shape described above.

However, as will be described later, the radiating element 15A may employ a quadruple-feed system or a single-feed system so as to be able to perform at least one of transmission or reception of radio waves having desired polarization, for example. Further, the polarized waves are not limited to the circularly polarized waves, but may also be linearly polarized waves.

The dielectric 15B is a substantially-quadrilateral plate-shaped member made of a dielectric material such as ceramic or the like. However, the dielectric 15B is not limited to a substantially quadrilateral shape, but may also be a circular or elliptical shape, for example.

The front surface and the back surface of the dielectric 15B are, as illustrated in in FIG. 2, parallel to the X direction and the Y direction, and the front surface of the dielectric 15B is oriented in the +Z direction, while the back surface of the dielectric 15B is oriented in the −Z direction. A conductive pattern functioning as a ground conductor plate (ground conductor film) is formed at the back surface of the dielectric 15B. The back surface of the dielectric 15B is attached to the substrate 14 with adhesive, double-sided tape, solder, or the like (not illustrated), for example. Accordingly, the electronic component 15 results in being disposed at the substrate 14.

The elastic body 20 is a cushioning material disposed between members constituting the electronic device 10. Further, the elastic body 20 is also a member to ensure the waterproofness of the accommodation space 13 in the electronic device 10. In an embodiment of the present disclosure, the elastic body 20 is provided so as to cover the side surface of the substrate 14. Note that the elastic body 20 may be provided so as to cover the side surface of the electronic component 15, in addition to covering the side surface of the substrate 14.

Note that other details of the elastic body 20 will be described later.

Electronic Device 10X of Comparative Example

The following describes an electronic device 10X of a comparative example, before describing the details of the elastic body 20, which is a feature of the electronic device 10 of an embodiment of the present disclosure.

Figure 3:
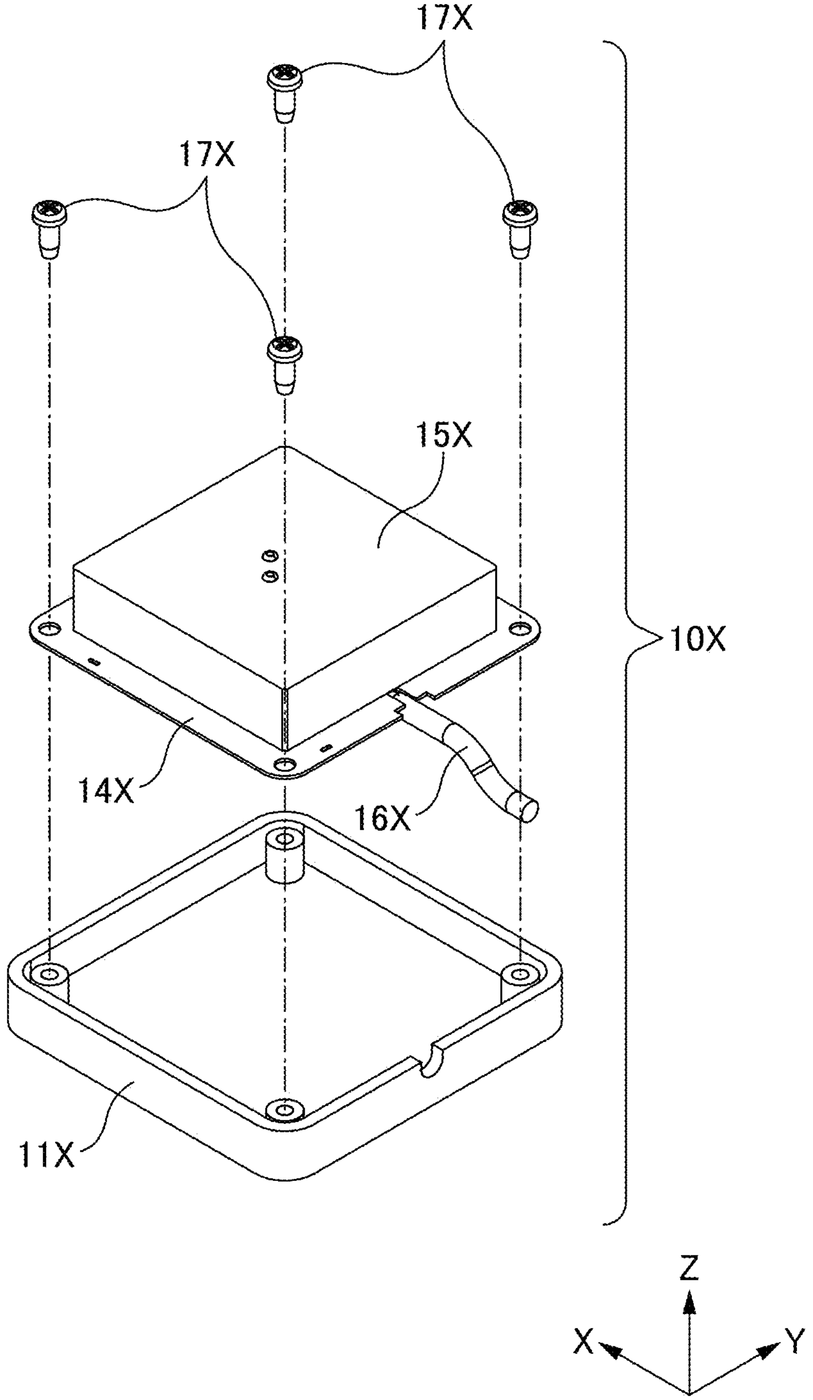
FIG. 3 is an exploded perspective view illustrating an electronic device 10X of a comparative example.

FIG. 3 is an exploded perspective view of the antenna device 10X of a comparative example.

As in the electronic device 10 of an embodiment of the present disclosure, the electronic device 10X of the comparative example includes a base 11X, a case 12X (not illustrated), a plate-shaped member 14X, and an electronic component 15X. Further, the electronic device 10X of the comparative example does not have the elastic body 20, unlike the electronic device 10 of an embodiment of the present disclosure. In the electronic device 10X of the comparative example, the electronic component 15X is disposed at the plate-shaped member 14X, as in the electronic device 10 of an embodiment of the present disclosure.

Here, in order to prevent the electronic component 15X from hitting other members thereby being damaged when the electronic device 10X receives shock or vibrations, it is needed that the plate-shaped member 14X at which the electronic component 15X is disposed is fixed to the exterior body (the base 11X or the case 12X). Thus, in the electronic device 10X of the comparative example, as illustrated in FIG. 3, the plate-shaped member 14X at which the electronic component 15X is disposed is fixed to the base 11X with a plurality of screws 17X. Specifically, the four corner portions of the plate-shaped member 14X formed in a substantially quadrilateral shape are fixed to the base 11X with four screws 17X, respectively.

However, in the electronic device 10X of the comparative example, although the electronic component 15X is prevented from hitting other components thereby being damaged when receiving shock or vibrations, stress may be concentrated on the four corners that are the fixed parts of the plate-shaped member 14X, and the plate-shaped member 14X may be damaged. With a reduction in the thickness of the plate-shaped member 14X, an increase in shock or vibrations received by the electronic device 10X, and/or the like, the plate-shaped member 14X may also be similarly damaged.

Details of Elastic Body 20

Thus, in the electronic device 10 of an embodiment of the present disclosure, the elastic body 20 sandwiched between the base 11 and the case 12 holds the plate-shaped member 14. That is, in the electronic device 10 of an embodiment of the present disclosure, the plate-shaped member 14 at which the electronic component 15 is disposed is held by the exterior body through the elastic body 20, without being directly fixed to the exterior body as in the electronic device 10X of the comparative example. This makes it possible to suppress damage to the plate-shaped member 14 at which the electronic component 15 is disposed. In addition, as compared to the electronic device 10X of the comparative example, the electronic device 10 of an embodiment of the present disclosure negates the need for the space of the plate-shaped member 14 for screwing, thereby being able to reduce the sizes of the plate-shaped member 14 and the exterior body, which makes it possible to achieve miniaturization of the electronic device 10.

Figure 5:
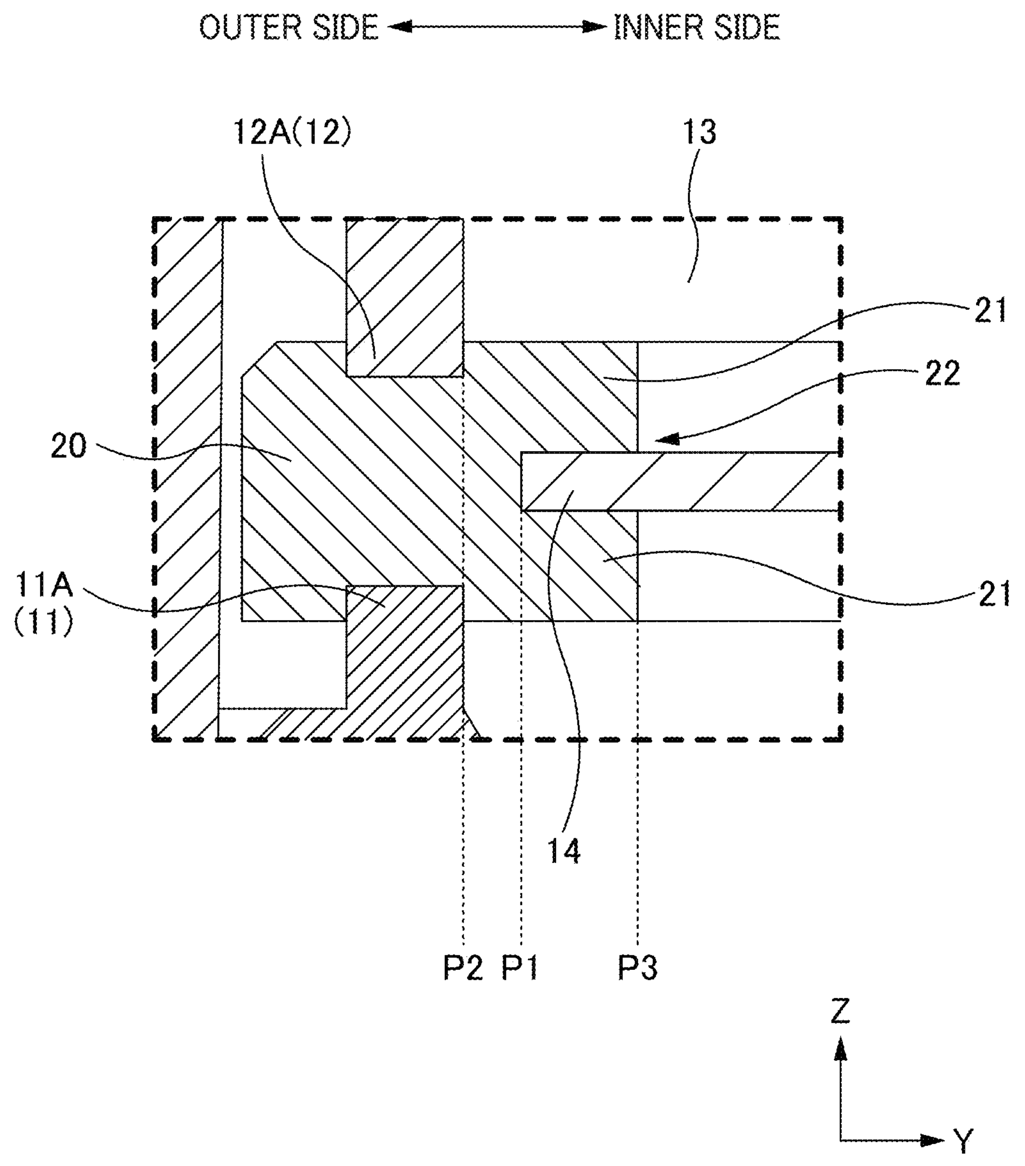
FIG. 5 is an enlarged view illustrating a cross section of an elastic body 20.

FIGS. 4A and 4B are diagrams to illustrate a cross section of the elastic body 20 of the electronic device 10. FIG. 4A is a perspective view of the electronic device 10 illustrating a cutting line, and FIG. 4B is a diagram illustrating a cross section of the electronic device 10 taken along a line A-A. FIG. 5 is an enlarged view of the cross-section illustrating the elastic body 20. The following describes the details of the elastic body 20 with reference to the above-described FIG. 2 as well.

<Holding Elastic Body 20 With Base 11 and Case 12>

First, in an embodiment of the present disclosure, the elastic body 20 is sandwiched between the base 11 and the case 12, as illustrated in FIGS. 4B and 5. Specifically, as illustrated in FIG. 5, the base 11 has a first protruding portion 11A that protrudes upward from the main body of the base 11. Further, the case 12 has a second protruding portion 12A that protrudes downward from the main body of the case 12. The elastic body 20 is sandwiched between the end part of the first protruding portion 11A and the end part of the second protruding portion 12A. Here, the "end part" of a certain member does not mean only the tip of the member, but includes a part in a range corresponding to a predetermined distance from the tip.

The elastic body 20 does not have to be sandwiched between such protruding portions as the first protruding portion 11A and the second protruding portion 12A. For example, the base 11 does not have to have the first protruding portion 11A, and the case 12 does not have to have the second protruding portion 12A. Then, the elastic body 20 may be sandwiched between the base 11 and the case 12, each of which has no protruding portion. Further, the elastic body 20 may be sandwiched between the end part of the first protruding portion 11A of the base 11 and the case 12 having no protruding portion. Furthermore, it may be sandwiched between the base 11 having no protruding portion and the end part of the second protruding portion 12A of the case 12.

However, as in an embodiment of the present disclosure, with the elastic body 20 being sandwiched between the end part of the first protruding portion 11A and the end part of the second protruding portion 12A, it is possible to reduce the area in which the elastic body 20 is sandwiched, thereby being able to increase the compressive force when the elastic body 20 is sandwiched therebetween. Accordingly, with the elastic body 20 being sandwiched between the end part of the first protruding portion 11A and the end part of the second protruding portion 12A, it is possible to sufficiently sandwich the elastic body 20, and in particular, improve the waterproofness of the accommodation space 13.

As above, the elastic body 20 is sandwiched with the base 11 and the case 12, resulting in being held by the exterior body of the electronic device 10, which is constituted by the base 11 and the case 12.

Further, the elastic body 20 has a grommet 25, as illustrated in FIG. 2 described above. The grommet 25 is a part of the elastic body 20 through which the coaxial cable 16 is inserted. In an embodiment of the present disclosure, with the grommet 25 being sandwiched with the base 11 and the case 12, it is possible to improve the waterproofness around the coaxial cable 16.

The inner diameter of the grommet 25 through which the coaxial cable 16 is inserted is formed slightly larger than the diameter (outer diameter) of the coaxial cable 16. In the interior of the grommet 25, at least one rib not illustrated that protrudes toward the coaxial cable 16 is provided thereto around the outer periphery of the coaxial cable 16. With the grommet 25 having such an internal shape, it is possible to facilitate the insertion of the coaxial cable 16 into the grommet 25, and ensure waterproofness around the coaxial cable 16. However, the rib may not be provided in the interior of the grommet 25, and the inner diameter of the grommet 25 may be substantially the same as the diameter of the coaxial cable 16.

<Holding of Plate-Shaped Member 14 with Elastic Body 20>

Next, in an embodiment of the present disclosure, the elastic body 20 includes a holding portion 21.

The holding portion 21 is a portion of the elastic body 20 that holds the plate-shaped member 14. In an embodiment of the present disclosure, a cut 22 is formed in the holding portion 21 along the end part of the plate-shaped member 14, as illustrated in FIG. 2. Then, as illustrated in FIG. 5, with the end part of the plate-shaped member 14 being inserted into this cut 22, the parts of the elastic body 20 above and below the cut 22 sandwich the plate-shaped member 14, to thereby hold the plate-shaped member 14. Accordingly, in an embodiment of the present disclosure, the holding portion 21 is a portion of the elastic body 20 located above and below the cut 22. With the elastic body 20 including the holding portion 21 in which the cut 22 is formed, it is possible to facilitate manufacturing of a structure in which the elastic body 20 holds the plate-shaped member 14.

In an embodiment of the present disclosure, an end part P1 of the plate-shaped member 14 is located on the inner side relative to a position P2, which is the innermost position in the region, in the elastic body 20, sandwiched between the base 11 and the case 12, (hereinafter, referred to as position P2) as illustrated in FIG. 5.

Here, the phrase "on the inner side" means "on the side toward the center of the accommodation space 13", as illustrated in FIG. 5. On the other hand, the phrase "on the outer side" means "on the side away from the center of the accommodation space 13", as illustrated in FIG. 5. The phrase "the center of the accommodation space 13" means "the center point in a solid assuming the solid filling the accommodation space 13", that is, "the geometric center in the solid".

Furthermore, the phrase "the innermost position of the region, in the elastic body 20, sandwiched between the base 11 and the case 12" means "the position of the end on the inner side between these two positions: the position of the innermost end of the surface of the elastic body 20 contacting the base 11; and the position of the innermost end of the surface of the elastic body 20 contacting the case 12, in the cross-sectional view of the elastic body 20 illustrated in FIG. 5".

Specifically, in the case illustrated in FIG. 5, the position of the innermost end of the surface of the elastic body 20 contacting the base 11 and the position of the innermost end of the surface of the elastic body 20 contacting the case 12 are in the same position. Accordingly, the position P2 illustrated in FIG. 5 is the position of the innermost end of the surface of the elastic body 20 contacting the base 11, or the position of the innermost end of the surface of the elastic body 20 contacting the case 12. In the case illustrated in FIG. 6, which will be described later, the position of the innermost end of the surface of the elastic body 20 contacting the base 11 is different from the position of the innermost end of the surface of the elastic body 20 contacting the case 12. Accordingly, the position P2 illustrated in FIG. 6 corresponds to the position of the innermost end of the surface of the elastic body 20 contacting the case 12, which is the position of the end on the inner side.

In the case where the elastic body 20 is sandwiched between the end part of the first protruding portion 11A and the end part of the second protruding portion 12A as illustrated in FIG. 5, the innermost position in the region in the elastic body 20 sandwiched between the base 11 and the case 12 is the same as the position of the inner end part of the first protruding portion 11A or the position of the inner end part of the second protruding portion 12A. In this case, when the tips of the first protruding portion 11A and the second protruding portion 12A have a sharp shape, the innermost position of the region in the elastic body 20 sandwiched between the base 11 and the case 12 is the position of the tip of the first protruding portion 11A or the position of the tip of the second protruding portion 12A.

That is, in an embodiment of the present disclosure, as illustrated in FIG. 5, the base 11 and the case 12 sandwich the part of the elastic body 20 where the plate-shaped member 14 is not located, without sandwiching it together with the plate-shaped member 14. In other words, the plate-shaped member 14 does not exist between the first protruding portion 11A and the second protruding portion 12A, but only the elastic body 20 exists therebetween. The plate-shaped member 14 has large tolerances, such as manufacturing tolerances, and when the base 11 and the case 12 sandwich the elastic body 20 together with the plate-shaped member 14 (i.e., when the end part P1 of the plate-shaped member 14 is located on the outer side relative to the position P2), the width of the part of the elastic body 20 sandwiched between the base 11 and the case 12 (distance between the end part of the first protruding portion 11A and the end part of the second protruding portion 12A) may vary significantly depending on the tolerances of the plate-shaped member 14 (the substrate in an embodiment of the present disclosure), and thus the compressive force when the elastic body 20 is sandwiched may vary.

Thus, in an embodiment of the present disclosure, the end part P1 of the plate-shaped member 14 is located on the inner side relative to the position P2, thereby being able to suppress significant variations in the width of the part of the elastic body 20 sandwiched between the base 11 and the case 12 due to the tolerances of the plate-shaped member 14, thereby being able to maintain the desired compression force. However, the end part P1 of the plate-shaped member 14 may be located on the outer side relative to the position P2 (the elastic body 20 may be sandwiched together with the plate-shaped member 14).

Further, in an embodiment of the present disclosure, as illustrated in FIG. 5, the holding portion 21 that holds the plate-shaped member 14 is located on the inner side relative to the position P2. This also suppresses significant variations in the width of the part of the elastic body 20 sandwiched between the base 11 and the case 12 due to the tolerances of the plate-shaped member 14, thereby being able to maintain the desired compressive force. However, the holding portion 21 may be located on the outer side relative to the position P2.

In this event, an inner end part P3 of the elastic body 20 is located on the inner side relative to the position P2, as illustrated in FIG. 5. This makes it possible that the holding part 21 that holds the plate-shaped member 14 is located on the inner side relative to the position at which the elastic body 20 is sandwiched between the base 11 and the case 12. However, the inner end part P3 of the elastic body 20 may be at the same position as the position P2.

In the case where the elastic body 20 is sandwiched between the end part of the first protruding portion 11A and the end part of the second protruding portion 12A as illustrated in FIG. 5, the inner end part P3 of the elastic body 20 is located on the inner side relative to at least one inner end (for example, position P2) of the first protruding portion 11A and the second protruding portion 12A. This makes it possible that the holding part 21 that holds the plate-shaped member 14 is located on the inner side relative to the position where the elastic body 20 is sandwiched between the base 11 and the case 12. However, the inner end part P3 of the elastic body 20 may be located on the outer side relative to at least one of the inner end portion of the first protruding portion 11A and the inner end of the second protruding portion 12A, as well as located on the inner side relative to at least one of the outer end part of the first protruding portion 11A and the outer end part of the second protruding portion 12A.

Here, in an embodiment of the present disclosure, the first protruding portion 11A and the second protruding portion 12A are provided so as to surround the plate-shaped member 14. Further, the elastic body 20 is formed in such a shape as to surround the plate-shaped member 14, as illustrated in FIG. 2 described above. That is, the elastic body 20 holds the circumferential portion of the plate-shaped member 14 while the circumferential portion of the elastic body 20 is sandwiched between the end part of the first protruding portion 11A and the end part of the second protruding portion 12A. This enables the elastic body 20 to ensure the waterproofness of the accommodation space 13 of the electronic device 10 and function as a cushioning material for the plate-shaped member 14.

Further, the end part of the first protruding portion 11A and the end part of the second protruding portion 12A are not limited to the shapes illustrated in FIG. 5, but may be formed in various shapes.

First Modification Example

Figure 6:
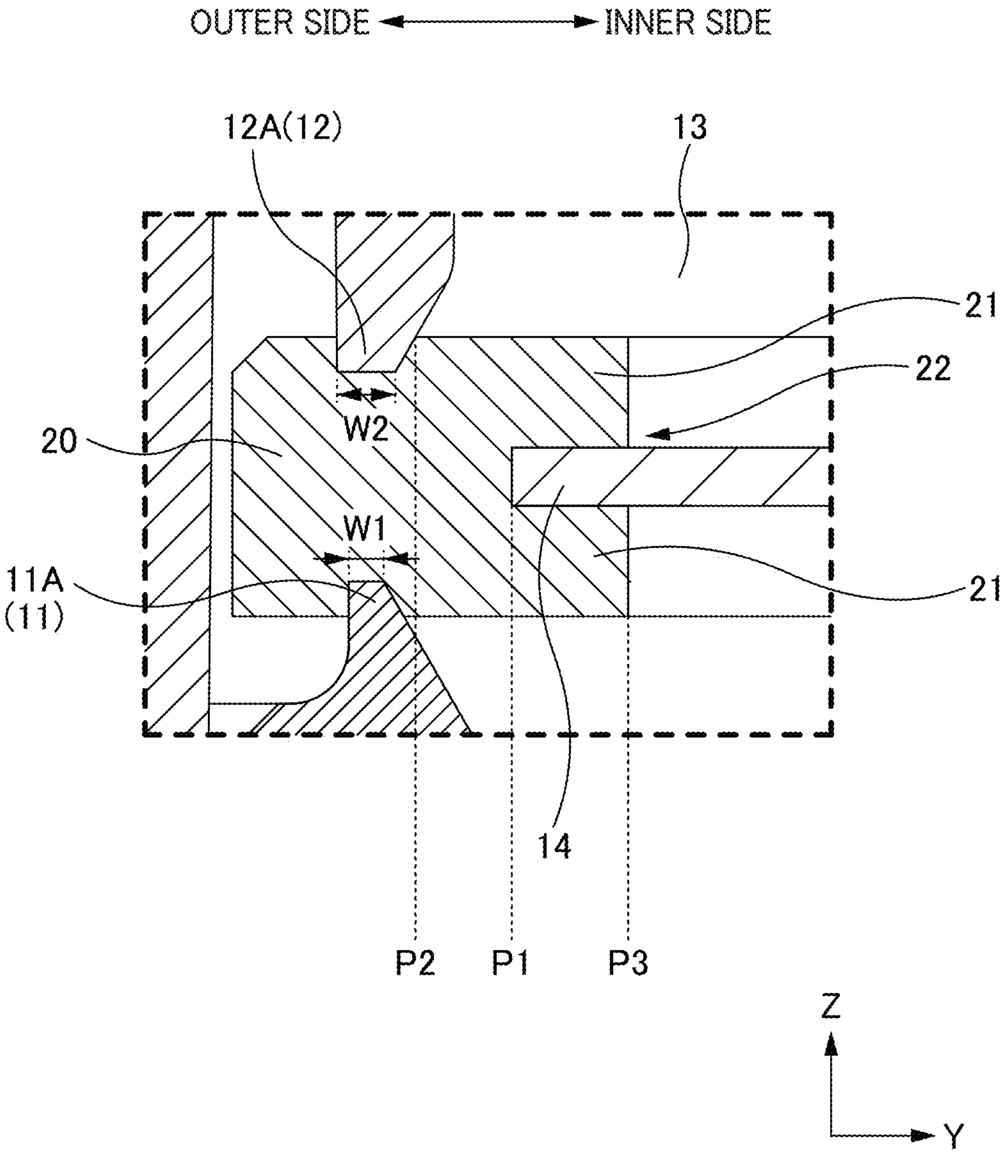
FIG. 6 is an enlarged view illustrating a cross section of an elastic body 20 according to a first modification example.

FIG. 6 is an enlarged view of a cross-section of the elastic body 20 according to a first modification example. The end part of the first protruding portion 11A and the end part of the second protruding portion 12A are formed into a tapered shape, as illustrated in FIG. 6. That is, each of the end part of the first protruding portion 11A and the end part of the second protruding portion 12A is formed such that the width in the left-right direction decreases toward the tip thereof. Thus, the width of the end part can be formed smaller, thereby being able to suppress the reaction force from the elastic body 20 when the elastic body 20 is sandwiched. Accordingly, the elastic body 20 can be sandwiched more reliably. However, only one of the end of the first protruding portion 11A and the end of the second protruding portion 12A may be formed into a tapered shape. Further, the end part of the first protruding portion 11A and the end part of the second protruding portion 12A may have a pointed tip shape, a hemispherical shape, or a semi-elliptical spherical shape, in addition to a tapered shape as illustrated in FIG. 6.

Further, as illustrated in FIG. 6, assuming that the width of the end part of the first protruding portion 11A to sandwich the elastic body 20 is W1, and the width of the end part of the second protruding portion 12A to sandwich the elastic body 20 is W2, the width (W2) of the end part of the second protruding portion 12A to sandwich the elastic body 20 is larger than the width (W1) of the end portion of the first protruding portion 11A to sandwich the elastic body 20 (W2>W1). However, the width (W1) of the end part of the first protruding portion 11A to sandwich the elastic body 20 may be larger than the width (W2) of the end part of the second protruding portion 12A to sandwich the elastic body 20 (W1>W2). Further, the width (W1) of the end part of the first protruding portion 11A to sandwich the elastic body 20 may be the same as the width (W2) of the end part of the second protruding portion 12A to sandwich the elastic body 20 (W1=W2).

Among the above, with the width (W1) of the end part of the first protruding portion 11A and the width (W2) of the end part of the second protruding portion 12A being set different from each other (W2>W1 or W1>W2), the elastic body 20 can be reliably sandwiched even if the widths of the end parts of the protruding portion 11A and the second protruding portion 12A vary due to tolerances such as manufacturing tolerances. This is because it is possible to prevent the end part of the first protruding portion 11A and the end part of the second protruding portion 12A from sandwiching the elastic body 20 in staggered manner due to the widths thereof varying with tolerances.

Among the above, it is particularly desirable that the width (W2) of the end part of the second protruding portion 12A is larger than the width (W1) of the end part of the first protruding portion 11A (W2>W1). In other words, it is desirable that the width of the end part of the first protruding portion 11A is set smaller than the width of the end part of the second protruding portion 12A, to thereby reduce the reaction force from the elastic body 20 when being sandwiched, on the first protruding portion 11A side. This is because the base 11 having the first protruding portion 11A formed therein is thinner than the case 12 having the second protruding portion 12A formed therein, as illustrated in FIG. 4B, and thus receive a larger effect of the reaction force from the elastic body 20 caused by the elastic body 20 being sandwiched. Accordingly, with the width of the end part of the first protruding portion 11A being set smaller than the width of the end part of the second protruding portion 12A, it is possible to suppress the effect of the reaction force from the elastic body 20 on the base 11.

As described above, in an embodiment of the present disclosure, as illustrated in FIG. 5, the end part of the plate-shaped member 14 is inserted into the cut 22, so that the holding portion 21 holds the end part of the plate-shaped member 14. However, an aspect in which the end part of the plate-shaped member 14 is held by the holding portion 21 is not limited to the case illustrated in FIG. 5.

Second Modification Example

Figure 7:
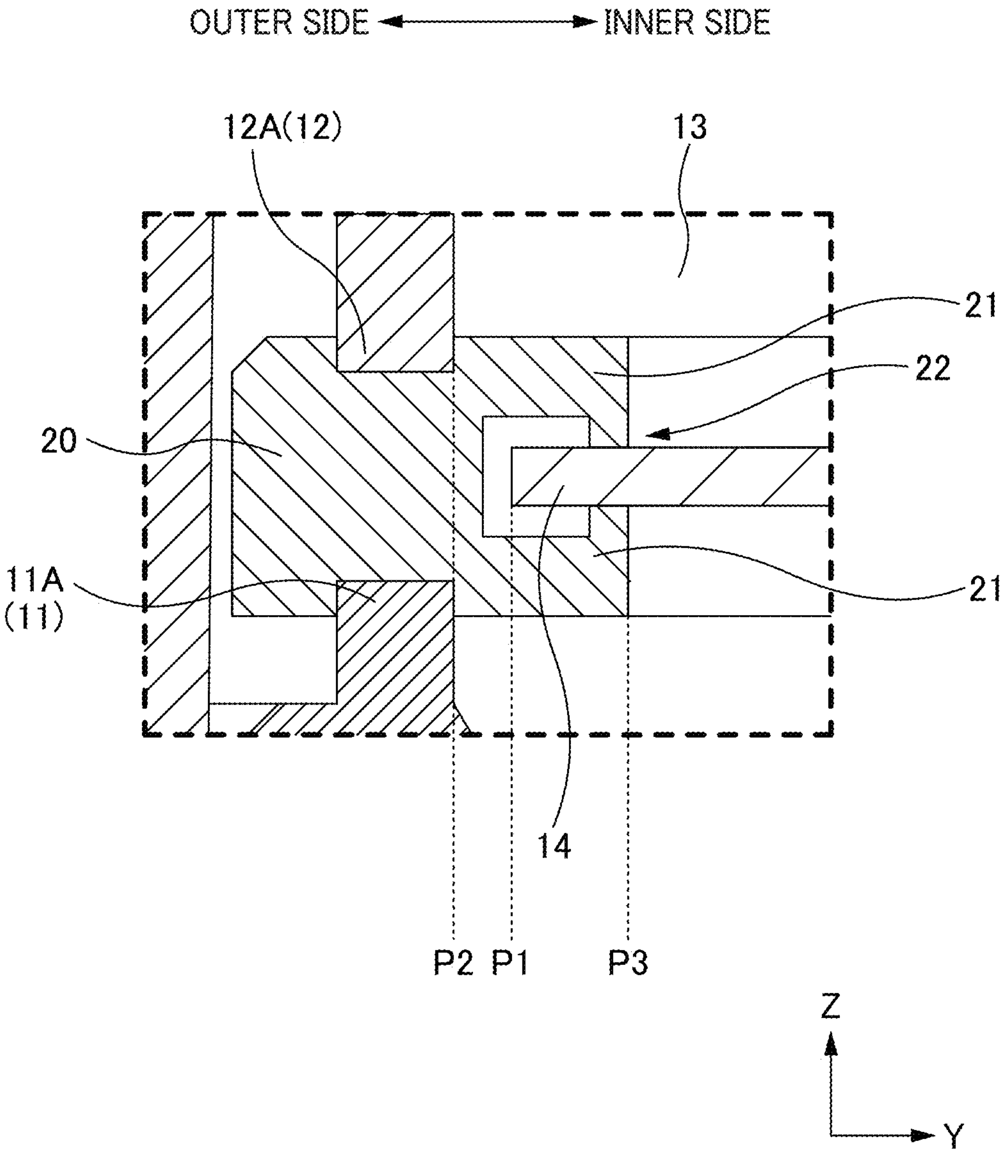
FIG. 7 is an enlarged view illustrating a cross section of an elastic body 20 according to a second modification example.

FIG. 7 is an enlarged view of a cross-section of the elastic body 20 according to a second modification example.

The holding portion 21 illustrated in FIG. 5 holds the end part of the plate-shaped member 14, including the tip PI of the plate-shaped member 14. However, as illustrated in FIG. 7, a configuration may be such that at least a part of the end part of the plate-shaped member 14 is held but the tip end part Pl of the plate-shaped member 14 is not held. However, the holding portion 21 holds the plate-shaped member 14 over the entire circumference of the plate-shaped member 14, as illustrated in FIG. 2. Further, the electronic device 10 may have a part, of the entire circumference of the plate-shaped member 14, in which the plate-shaped member 14 is not held by the holding portion 21. As such, the holding portion 21 may have any aspect as long as it can hold the plate-shaped member 14.

In an embodiment of the present disclosure described above, a description has been given of the electronic device 10 of a double-feed system as illustrated in FIG. 2. Further, a description has been given of the elastic body 20 of the electronic device 10 in the case of covering only the side surface of the plate-shaped member 14. However, the present disclosure is not limited to such a case.

Electronic Device 40 of Second Embodiment

Figure 8:
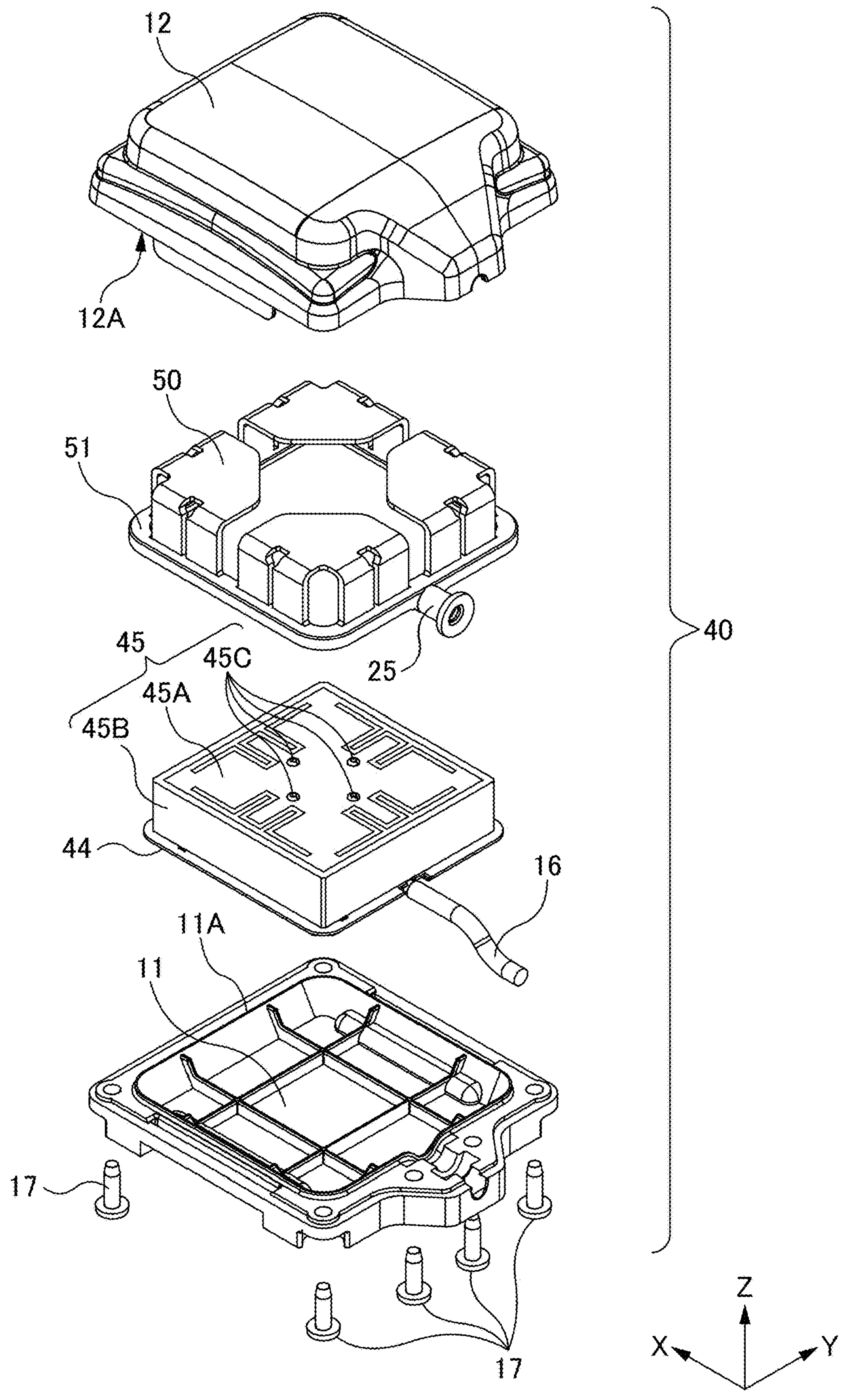
FIG. 8 is an exploded perspective view illustrating an electronic device 40 of a second embodiment.
Figure 9A:
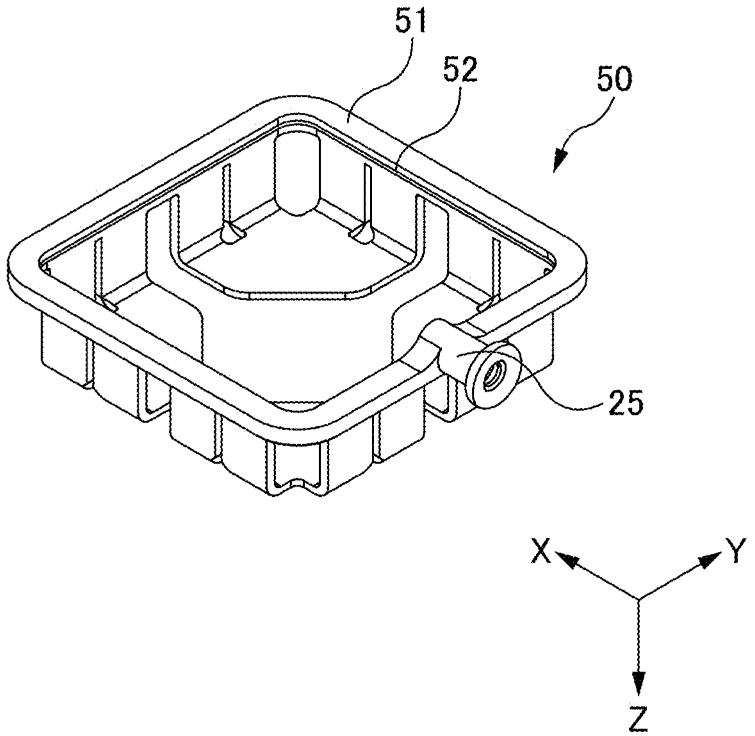
FIG. 9A is a perspective view illustrating an elastic body 50 when viewed from below.
Figure 9B:
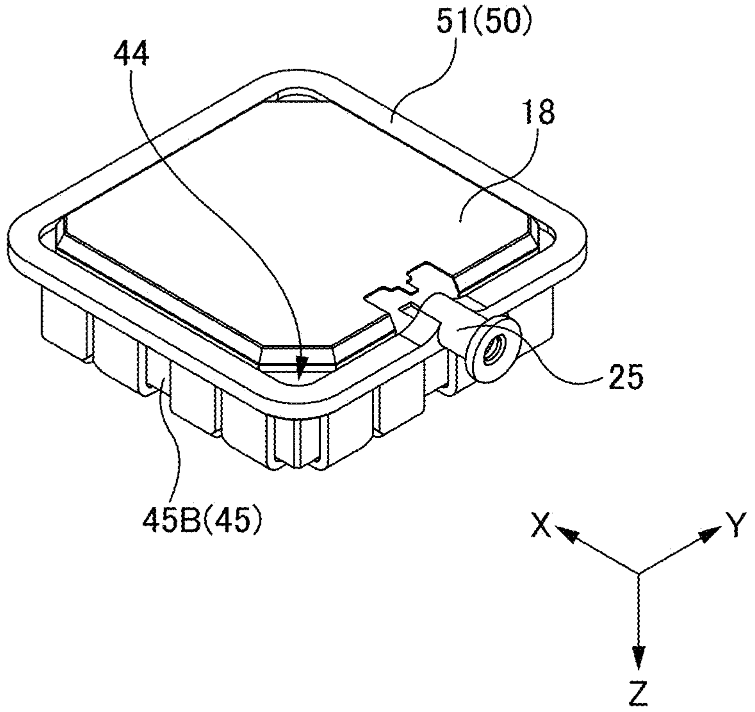
FIG. 9B is a perspective view of an elastic body 50 when attached to a plate-shaped member 44 and an electronic component 45.

FIG. 8 is an exploded perspective view of an electronic device 40 in a second embodiment. FIG. 9A is a perspective view of an elastic body 50 when viewed from below, and FIG. 9B is a perspective view of the elastic body 50 when attached to the plate-shaped member 44 and an electronic component 45.

The electronic component 45 of the electronic device 40 of the second embodiment is a patch antenna that supports radio waves of at least two frequency bands among a plurality of frequency bands such as L1 band, L2 band, L5 band, and the like in order to achieve a wider frequency band and increase gain. Then, the electronic component 45 performs at least one of transmission or reception of radio waves from the desired frequency band. The electronic device 40 of the second embodiment employs the quadruple-feed system, as illustrated in FIG. 8. That is, the electronic component 45 includes a radiating element 45A, a dielectric 45B, and four feeding points 45C.

Here, in the electronic device 10X of the comparative example illustrated in FIG. 3 described above, the electronic component 15X may increase in size when supporting a plurality of frequency bands and/or supporting relatively low radio waves, due to the demand for wider bandwidth and higher gain. Then, in the electronic device 10X of the comparative example, the gravity applied to the electronic component 15X also increases, and stress concentrates on the fixed portions of the plate-shaped member 14X, which may damage the plate-shaped member 14X.

Thus, in the electronic device 40 of the second embodiment, even if the electronic component 45 increases in size as described above, the elastic body 50 has a holding portion 51 as in the electronic device 10 of the first embodiment, and a cut 52 is formed in the holding portion 51 along the edge of the plate-shaped member 44. Accordingly, this results in a configuration in which the elastic body 50 holds the plate-shaped member 44 with the end of the plate-shaped member 44 being inserted into the cut 52. With the plate-shaped member 44 being held through the elastic body 50 that is held by the exterior body, it is possible to exert an effect of suppressing damage to the plate-shaped member 44 at which the electronic component 45 is disposed.

Further, in the electronic device 40 of the second embodiment, the elastic body 50 is provided so as not only cover the side surface of the plate-shaped member 44, but also to cover at least part of a side portion and upper portion of the electronic component 45, as illustrated in FIGS. 8 to 9B.

The electronic device 40 of the second embodiment has the same configuration as the electronic device 10 of the first embodiment, except that the quadruple-feed system is employed and the elastic body 50 is disposed so as to cover at least part of the side portion and the top portion of the electronic component 45.

Further, the electronic device may be an electronic device employing the single-feed system, although not illustrated, other than the electronic device 40 of the second embodiment employing the quadruple-feed system. Even in this case, as in the electronic device 10 of the first embodiment, the plate-shaped member is held through the elastic body that is held by the exterior body, thereby being able to suppress damage to the plate-shaped member at which the electronic component is disposed.

Summary

The electronic device 10 of an embodiment of the present disclosure has been described above. The electronic device 10 of an embodiment of the present disclosure includes the base 11, the case 12 forming the accommodation space 13 together with the base, the electronic component 15 accommodated in the accommodation space, the plate-shaped member 14 at which the electronic component 15 is disposed, and the elastic body 20 sandwiched between the base 11 and the case 12, as illustrated in FIGS. 1, 2, 4B, and 5, for example. The elastic body 20 includes the holding portion 21 to hold the plate-shaped member 14, as illustrated in FIGS. 4B and 5, for example. According to the electronic device 10 of an embodiment of the present disclosure, it is possible to suppress damage to the plate-shaped member 14 at which the electronic component 15 is disposed.

Further, in the electronic device 10 of an embodiment of the present disclosure, the holding portion 21 holds the end part of the plate-shaped member 14, as illustrated in FIGS. 4B and 5, for example. This can suppress damage to the plate-shaped member 14 at which the electronic component 15 is disposed.

Further, in the electronic device 10 of an embodiment of the present disclosure, in a cross-sectional view, when the side toward the center of the accommodation space 13 is defined as the inner side, the end part P1 of the plate-shaped member 14 is located on the inner side relative to the innermost position P2 of the region in the elastic body 20 sandwiched between the base 11 and the case 12, as illustrated in FIGS. 4B and 5, for example. This makes it possible to suppress significant variations in the width of the part of the elastic body 20 between the base 11 and the case 12 due to the tolerances of the plate-shaped member 14, thereby being able to maintain the desired compressive force.

Further, in the electronic device 10 of an embodiment of the present disclosure, in the cross-sectional view, when the side toward the center of the accommodation space 13 is the inner side, the holding portion 21 is located on the inner side relative to the innermost position P2 of the region in the elastic body 20 sandwiched between the base 11 and the case 12, as illustrated in FIGS. 4B and 5, for example. This makes it possible to suppress significant variations in the width of the part of the elastic body 20 between the base 11 and the case 12 due to the tolerances of the plate-shaped member 14, thereby being able to maintain the desired compressive force.

Further, in the electronic device 10 of an embodiment of the present disclosure, in the cross-sectional view, when the side toward the center of the accommodation space 13 is defined as the inner side, the inner end part P3 of the elastic body 20 is located on the inner side relative to the innermost position P2 of the region in the elastic body 20 sandwiched between the base 11 and the case 12, as illustrated in FIGS. 4B and 5, for example. This makes it possible that the holding portion 21 that holds the plate-shaped member 14 is located on the inner side relative to the position where the base 11 and the case 12 sandwiches the elastic body 20, thereby being able to suppress significant variations in the width of the part of the elastic body 20 sandwiched between the base 11 and the case 12 due to the tolerances of the plate-shaped member 14, and maintain the desired compressive force.

Further, in the electronic device 10 of an embodiment of the present disclosure, the cut 22 is formed in the holding portion 21, to hold the plate-shaped member 14 by sandwiching the plate-shaped member 14 therebetween, as illustrated in FIG. 5, for example. This makes it possible to facilitate manufacturing of a configuration in which the elastic body 20 holds the plate-shaped member 14.

Further, in the electronic device 10 of an embodiment of the present disclosure, one of the base 11 or the case 12 includes the protruding portion (the first protruding portion 11A or the second protruding portion 12A), and the elastic body 20 is sandwiched between the end part of the protruding portion and one of the base 11 or the case 12. This makes it possible to sufficiently sandwich the elastic body 20 with the base 11 and the case 12.

Further, in the electronic device 10 of an embodiment of the present disclosure, the base 11 includes the first protruding portion 11A, the case 12 includes the second protruding portion 12A, and the elastic body 20 is sandwiched between the end part of the first protruding portion 11A and the end part of the second protruding portion 12A, as illustrated in FIGS. 4B and 5, for example. This makes it possible to sufficiently sandwich the elastic body 20 between the base 11 and the case 12.

Further, in the electronic device 10 of an embodiment of the present disclosure, each of the end part of the first protruding portion 11A and the end part of the second protruding portion 12A is formed into a tapered shape, as illustrated in FIGS. 4B and 5, for example. This makes it possible to sufficiently sandwich the elastic body 20 with the base 11 and the case 12.

Further, in the electronic device 10 of an embodiment of the present disclosure, for example, as illustrated in FIG. 5, one of the width (W1) of the end part of the first protruding portion 11A to sandwich the elastic body 20 or the width (W2) of the end part of the second protruding portion 12A to sandwich the elastic body 20 is larger than the other thereof (W2>W1). This makes it possible to sufficiently sandwich the elastic body 20 with the base 11 and the case 12, even if the end part of the first protruding portion 11A and the end part of the second protruding portion 12A that face each other are deviated from each other.

Further, in the electronic device 10 of an embodiment of the present disclosure, in the cross-sectional view, when the side toward the center of the accommodation space 13 is defined as the inner side, the inner end part P3 of the elastic body 20 is located on the inner side relative to the inner end part (for example, the position P2) of at least one of the first protruding portion 11A or the second protruding portion 12A, as illustrated in FIGS. 4B and 5, for example. This makes it possible that the holding part 21 that holds the plate-shaped member 14 is located on the inner side relative to the position where the base 11 and the case 12 sandwich the elastic body 20, thereby being able to suppress significant variations in the width of the part of the elastic body 20 sandwiched between the base 11 and the case 12 due to the tolerances of the plate-shaped member 14, and maintain the desired compressive force.

Further, in the electronic device 10 of an embodiment of the present disclosure, the holding portion 21 holds the plate-shaped member 14 over the entire circumference of the plate-shaped member 14, as illustrated in FIG. 2, for example. This makes it possible to suppress damage to the plate-shaped member 14 at which the electronic component 15 is disposed.

Further, in the electronic device 10 of an embodiment of the present disclosure, the electronic component 15 is a patch antenna, as illustrated in FIGS. 2 and 8, for example. This makes it possible to suppress damage to the plate-shaped member 14 at which the patch antenna is disposed.

Embodiments of the present disclosure described above are simply to facilitate understanding of the present disclosure and are not in any way to be construed as limiting the present disclosure. In addition, the present invention can be modified or improved within the scope of the gist of the present invention, and it is needless to say that equivalents thereof are included in the present invention.

REFERENCE SIGNS LIST

10, 10X, 40 electronic device
11, 11X base
11A first protruding portion
12, 12X case
12A second protruding portion
13 accommodation space
14, 14X, 44 plate-shaped member (substrate)
15, 15X, 45 electronic component (antenna, patch antenna)
15A, 45A radiating element
15B, 45B dielectric
15C, 45C feeding point
16, 16X coaxial cable
17, 17X screw
18 shield cover
20, 50 elastic body
21, 51 holding portion
22, 52 cut
25 grommet

The invention claimed is:

1. An electronic device comprising:
a base;
a case forming an accommodation space together with the base;
an electronic component accommodated in the accommodation space;
a plate-shaped member at which the electronic component is disposed;
an elastic body sandwiched between the base and the case; and
a cable electrically connected to at least one of the electronic component or the plate- shaped member, wherein
the elastic body includes a holding portion to hold the plate-shaped member and a grommet through which the cable is inserted, and
the elastic body covers at least part of the electronic component.

2. The electronic device according to claim 1, wherein the holding portion holds an end part of the plate-shaped member.

3. The electronic device according to claim 2, wherein, in a cross-sectional view, when a side toward a center of the accommodation space is defined as an inner side, the end part of the plate-shaped member is located on the inner side relative to an innermost position of a region in the elastic body sandwiched between the base and the case.

4. The electronic device according to claim 1, wherein, in a cross-sectional view, when a side toward a center of the accommodation space is defined as an inner side, the holding portion is located on the inner side relative to an innermost position of a region in the elastic body sandwiched between the base and the case.

5. The electronic device according to claim 1, wherein, in a cross-sectional view, when a side toward a center of the accommodation space is defined as an inner side, an inner end of the elastic body is located on the inner side relative to an innermost position of a region in the elastic body sandwiched between the base and the case.

6. The electronic device according to claim 1, wherein a cut is formed in the holding portion, to hold the plate-shaped member by sandwiching the plate-shaped member therebetween.

7. The electronic device according to claim 1, wherein
one of the base or the case includes a protruding portion, and
the elastic body is sandwiched between an end part of the protruding portion and the other of the base or the case.

8. The electronic device according to claim 1, wherein
the base includes a first protruding portion,
the case includes a second protruding portion, and
the elastic body is sandwiched between an end part of the first protruding portion and an end part of the second protruding portion.

9. The electronic device according to claim 8, wherein each of the end part of the first protruding portion and the end part of the second protruding portion is formed into a tapered shape.

10. The electronic device according to claim 8, wherein one of a width of the end part of the first protruding portion to sandwich the elastic body or a width of the end part of the second protruding portion to sandwich the elastic body is larger than the other thereof.

11. The electronic device according to claim 8, wherein, in a cross-sectional view, when a side toward a center of the accommodation space is defined as an inner side, an inner end of the elastic body is located on the inner side relative to an inner end of at least one of the first protruding portion or the second protruding portion.

12. The electronic device according to claim 1, wherein the holding portion holds the plate-shaped member over an entire circumference of the plate-shaped member.

13. The electronic device according to claim 1, wherein the electronic component is a patch antenna.

14. The electronic device according to claim 1, wherein the at least part of the electronic component is a side portion of the electronic component and at least one of an upper portion of the electronic component or a lower portion of the electronic component.

* * * * *